United States Patent
Nakazawa

(10) Patent No.: US 10,164,403 B2
(45) Date of Patent: Dec. 25, 2018

(54) CAP MEMBER AND LIGHT-EMITTING DEVICE

(71) Applicant: SHINKO ELECTRIC INDUSTRIES CO., LTD., Nagano-shi, Nagano (JP)

(72) Inventor: Katsuya Nakazawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 15/840,366

(22) Filed: Dec. 13, 2017

(65) Prior Publication Data

US 2018/0175584 A1    Jun. 21, 2018

(30) Foreign Application Priority Data

Dec. 19, 2016  (JP) .................. 2016-245301

(51) Int. Cl.
*H01S 5/062* (2006.01)
*H01S 5/022* (2006.01)

(52) U.S. Cl.
CPC ...... *H01S 5/02296* (2013.01); *H01S 5/02212* (2013.01); *H01S 5/02236* (2013.01); *H01S 5/02276* (2013.01); *H01S 5/062* (2013.01)

(58) Field of Classification Search
CPC .......................... H01S 5/02212; H01S 5/02296
See application file for complete search history.

(56) References Cited

U.S. PATENT DOCUMENTS

| 4,355,321 A | * | 10/1982 | Yeats | ............... | G02B 6/4204 |
| | | | | | 257/432 |
| 5,878,069 A | * | 3/1999 | Kamibayashi | ...... | H01S 5/02212 |
| | | | | | 372/109 |
| 2007/0237196 A1 | * | 10/2007 | Oomori | ............... | H01S 5/02236 |
| | | | | | 372/36 |
| 2009/0092168 A1 | * | 4/2009 | Yamauchi | ............. | G11B 7/127 |
| | | | | | 372/107 |
| 2009/0140416 A1 | * | 6/2009 | Ishida | ............... | H01S 5/02212 |
| | | | | | 257/704 |

FOREIGN PATENT DOCUMENTS

| JP | 58056482 A | * | 4/1983 | ........ H01L 31/0203 |
| JP | 2006-186166 | | 7/2006 | |
| JP | 2009-176764 | | 8/2009 | |
| JP | 2015-090932 | | 5/2015 | |
| JP | 2015090932 A | * | 5/2015 | ............. H01S 5/022 |

* cited by examiner

*Primary Examiner* — Joshua King
(74) *Attorney, Agent, or Firm* — Rankin, Hill & Clark LLP

(57) ABSTRACT

A cap member comprises a cylindrical part, an annular top plate part having an opening formed at a central portion thereof and being configured to cover one end of the cylindrical part, a window glass disposed inside the cylindrical part, and an adhesion member configured to adhere the top plate part and the window glass each other. The top plate part is depressed so that an opening end of the opening enters an inside of the cylindrical part, and an inner surface of the top plate part is configured as a flat inclined surface from a coupling part between the cylindrical part and the top plate part to the opening end.

7 Claims, 17 Drawing Sheets

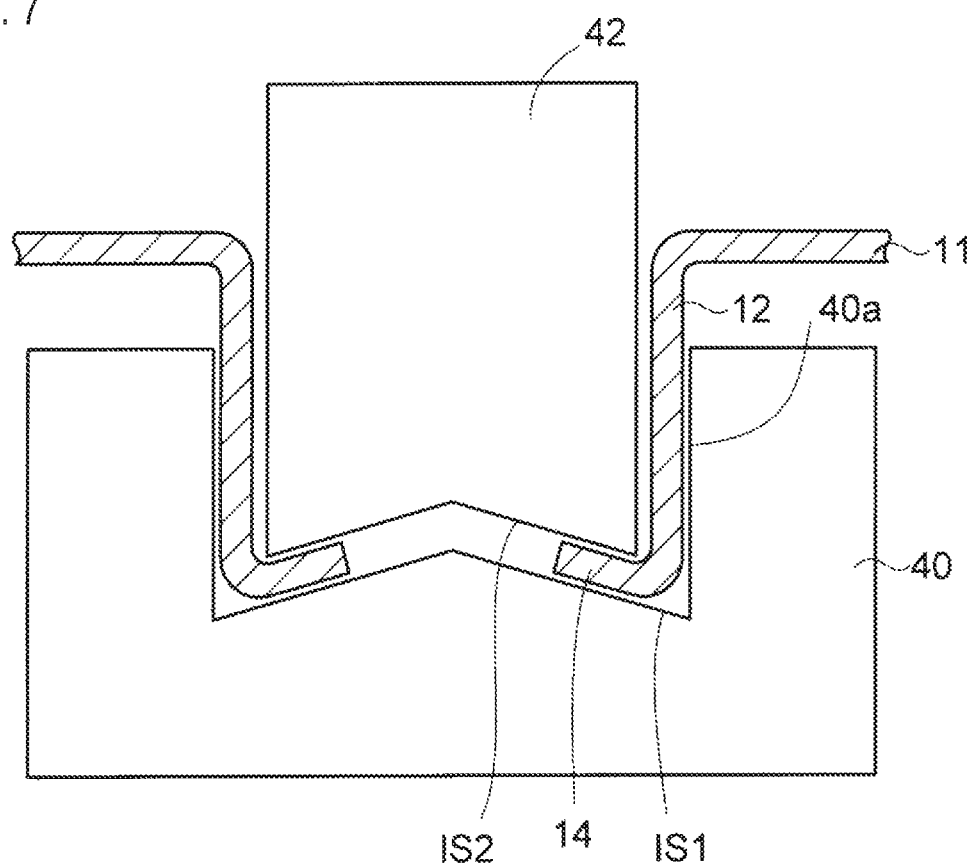

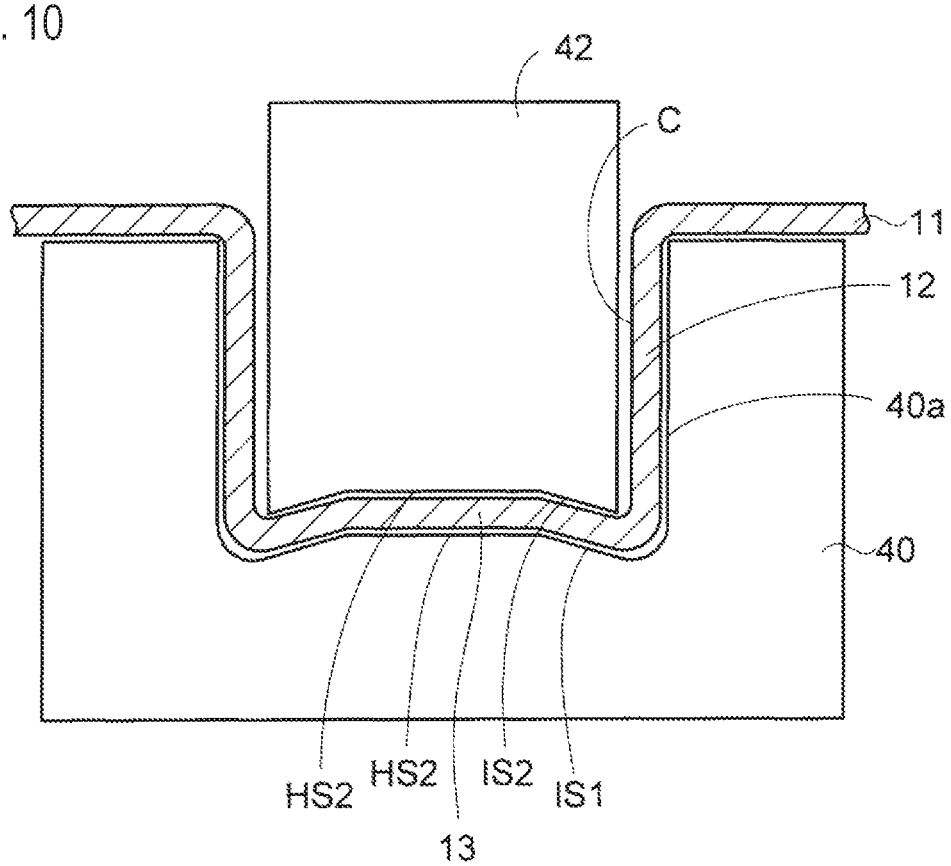

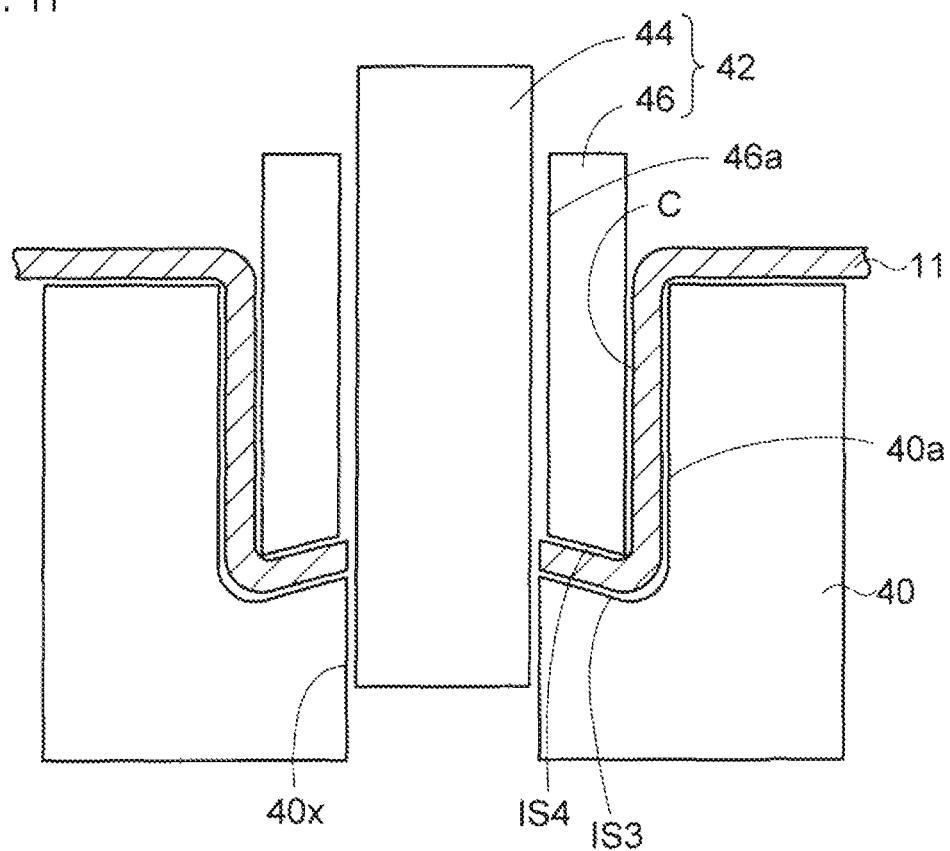

CAP MEMBER AND LIGHT-EMITTING DEVICE

CROSS-REFERENCE TO RELATED APPLICATION

The present application claims priority from Japanese Patent Application No. 2016-245301 filed on Dec. 19, 2016, the entire content of which is incorporated herein by reference.

BACKGROUND

Technical Field

The present invention relates to a cap member and a light-emitting device having the cap member.

Related Art

In the related art, an optical semiconductor device has been known in which a semiconductor laser element is mounted on a stem with being hermetically sealed by a cap member. Regarding the cap member of the optical semiconductor device, an opening can be provided at a center of a top plate part of a cap main body, so that a window glass adhered to the top plate part by a low-melting-point glass is disposed below the opening.

Patent Document 1: JP-A-2006-186166
Patent Document 2: JP-A-2009-176764
Patent Document 2: JP-A-2015-90932

As described later in paragraphs of preliminary matters, when adhering the window glass to the top plate part of the cap main body by the low-melting-point glass, since the low-melting-point glass flows into the opening of the top plate part, it is not possible to secure an effective diameter necessary for laser light to pass therethrough.

SUMMARY

Exemplary embodiments of the present invention provides a cap member having a novel structure capable of preventing an adhesion member from flowing into an opening of a cap main body when adhering a window glass to a top plate part of the cap main body by the adhesion member, and a light-emitting device.

A cap member according to the present invention comprises:
  a cylindrical part;
  an annular top plate part having an opening formed at a central portion thereof and being configured to cover one end of the cylindrical part;
  a window glass disposed inside the cylindrical part; and
  an adhesion member configured to adhere the top plate part and the window glass each other,
    wherein the top plate part is depressed so that an opening end of the opening enters an inside of the cylindrical part, and an inner surface of the top plate part is configured as a flat inclined surface from a coupling part between the cylindrical part and the top plate part to the opening end.

A light-emitting device according to the present invention comprises:
  a cap member comprising:
    a cap main body including:
      a cylindrical part, and
      an annular top plate part having an opening formed at a central portion and being configured to cover one end of the cylindrical part, the top plate part being depressed so that an opening end of the opening enters an inside of the cylindrical part, and an inner surface of the top plate part being configured as a flat inclined surface from a coupling part between the cylindrical part and the top plate part to the opening end;
    a window glass disposed inside the cylindrical part of the cap main body, and
    an adhesion member configured to adhere the top plate part and the window glass each other;
  a stem having an element mounting part; and
  a light-emitting element mounted on the element mounting part,
    wherein the cap member is fixed to the stem, and the light-emitting element is hermetically sealed by the cap member.

A manufacturing method of a cap member according to the present invention, the manufacturing method comprises:
  processing a metal plate to form a cup-shaped concave member having a cylindrical part and a bottom plate; and
  processing the bottom plate of the cup-shaped concave member to form an annular top plate part having an opening formed at a central portion thereof and depressed so that an opening end of the opening enters an inside of the cylindrical part,
    wherein an inner surface of the top plate part is configured as a flat inclined surface from a coupling part between the cylindrical part and the top plate part to the opening end.

According to the present invention, the cap member has the cap main body having the cylindrical part and the annular top plate part. The annular top plate part has the opening formed at the central portion thereof and is configured to cover one end of the cylindrical part. The top plate part of the cap main body is depressed so that the opening end of the opening enters the inside of the cylindrical part (the opening end of the opening is located within the cylindrical part), and the inner surface of the top plate part is configured as the flat inclined surface from the coupling part between the cylindrical part and the top plate part to the opening end.

When manufacturing the cap member, the top plate part of the cap main body is disposed at the lower side, and the window glass is adhered to the inner surface of the top plate part by the adhesion member.

At this state, the top plate part of the cap main body is inclined downward from the opening end of the opening toward the coupling part with the cylindrical part. For this reason, when the adhesion member disposed on the top plate part of the cap main body is melted, the adhesion member flows toward the coupling part of the top plate part with the cylindrical part.

Also, when the adhesion member is melted, since the window glass is in contact with the tip end of the top plate part of the cap main body, it is possible to prevent outflow of the adhesion member into the opening.

Alternatively, even when the window glass is not in contact with the tip end of the top plate part of the cap main body, the window glass comes close to the tip end of the cap main body, so that a flow space of the adhesion member is narrowed and a flow resistance is increased. Therefore, it is possible to suppress the outflow of the adhesion member into the opening.

In this way, since the opaque adhesion member is prevented from flowing into the opening of the top plate part of the cap main body, it is possible to positively secure an

BRIEF DESCRIPTION OF THE DRAWINGS

FIG. 7 is a sectional view depicting the first manufacturing method of the cap main body in accordance with the exemplary embodiment (3 thereof).

FIG. 10 is a sectional view depicting the second manufacturing method of the cap main body in accordance with the exemplary embodiment (2 thereof).

FIG. 11 is a sectional view depicting the second manufacturing method of the cap main body in accordance with the exemplary embodiment (3 thereof).

DETAILED DESCRIPTION

Hereinafter, an exemplary embodiment will be described with reference to the accompanying drawings.

Before describing the exemplary embodiment, preliminary matters, which are bases of the present invention, are first described. It should be noted that the preliminary matters relate to personal investigation contents of the inventors and include a novel technology, not a known technology.

FIGS. 1A-1C and 2A-2B illustrate a manufacturing method of a cap member relating to the preliminary matters.

Figure 1A:
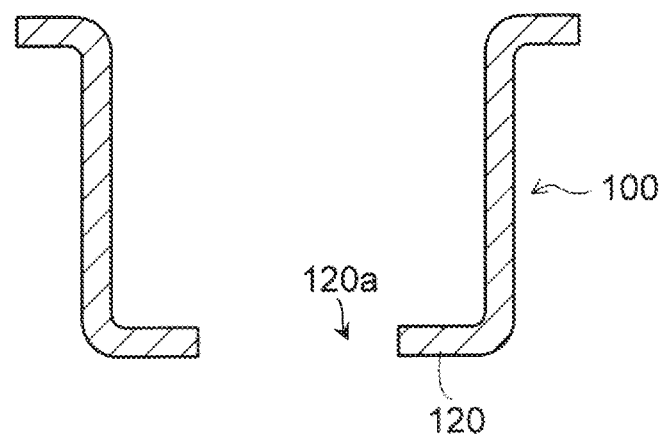
FIGS. 1A to 1C are sectional views depicting a manufacturing method of a cap member in accordance with preliminary matters (1 thereof).

As shown in FIG. 1A, a cylindrical metal cap 100 having an opening 120a formed at a center of a top plate part 120 is first prepared. Since the cap main body 100 of FIG. 1A is turned upside down to establish a cap member, a bottom plate at a state of FIG. 1A is referred to as the top plate part 120 for convenience sake.

Figure 1B:
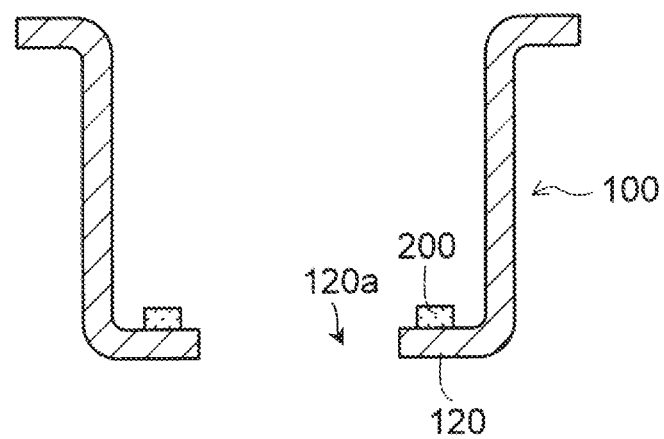

As shown in FIG. 1B, a doughnut-type low-melting-point glass 200 is disposed on an inner surface of the top plate part 120 of the cap main body 100. Also, as shown in FIG. 1C, a transparent window glass 300 is disposed on the low-melting-point glass 200.

Figure 1C:
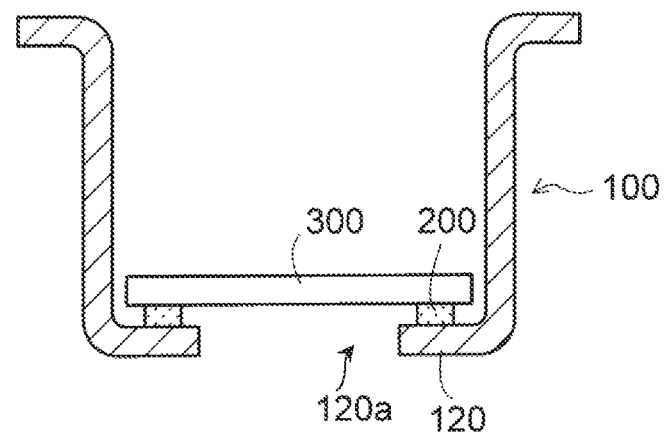
Figure 2A:
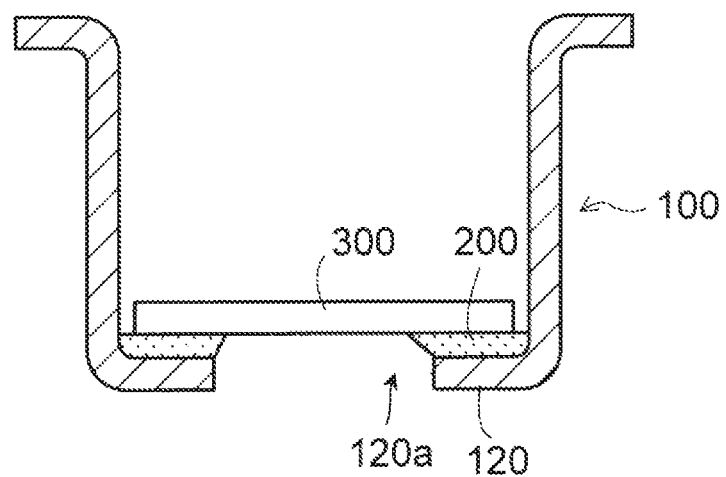
FIGS. 2A and 2B are a sectional view and a plan view depicting the manufacturing method of the cap member in accordance with the preliminary matters (2 thereof).

Then, as shown in FIG. 2A, the structure of FIG. 1C is disposed in a melting furnace, and the low-melting-point glass 200 is melted by a heating treatment. Thereby, the window glass 300 is adhered to the top plate part 120 of the cap main body 100 by the melted low-melting-point glass 200.

As a result, the opening 120a of the top plate part 120 of the cap main body 100 is closed and hermetically sealed by the window glass 300.

Figure 2B:
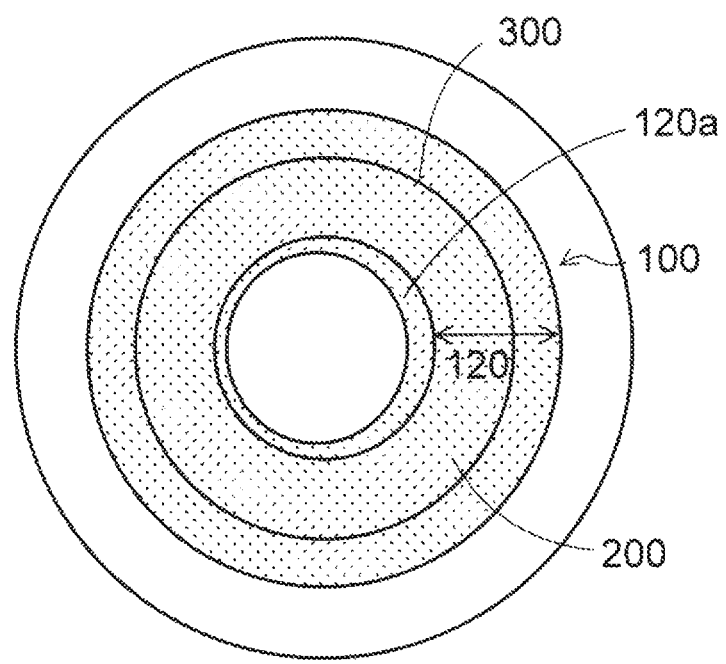

At this time, as shown in a plan view of FIG. 2B, since the inner surface of the top plate part 120 of the cap main body 100 is configured as a flat horizontal surface, the melted low-melting-point glass 200 flows to an inside and an outside from a part on the inner surface of the top plate part 120. For this reason, the low-melting-point glass 200 protrudes into the opening 120a of the cap main body 100.

Since the low-melting-point glass 200 is not transparent and has a light transmissivity considerably lower than the window glass 300, a portion in the opening 120a of the cap main body 100, in which the low-melting-point glass 200 has flown, does not function as an effective passing region of laser light.

For this reason, an effective diameter of the opening 120a of the cap main body 100 becomes substantially smaller than a design specification, so that it is not possible to secure an effective diameter necessary for a semiconductor laser element. Therefore, an output of the laser light is lowered or a spot diameter of the laser light is reduced, so that it is not possible to obtain a desired characteristic of the laser light.

In a cap member of an exemplary embodiment to be described later, it is possible to solve the above problems.

Exemplary Embodiment

Figure 3:
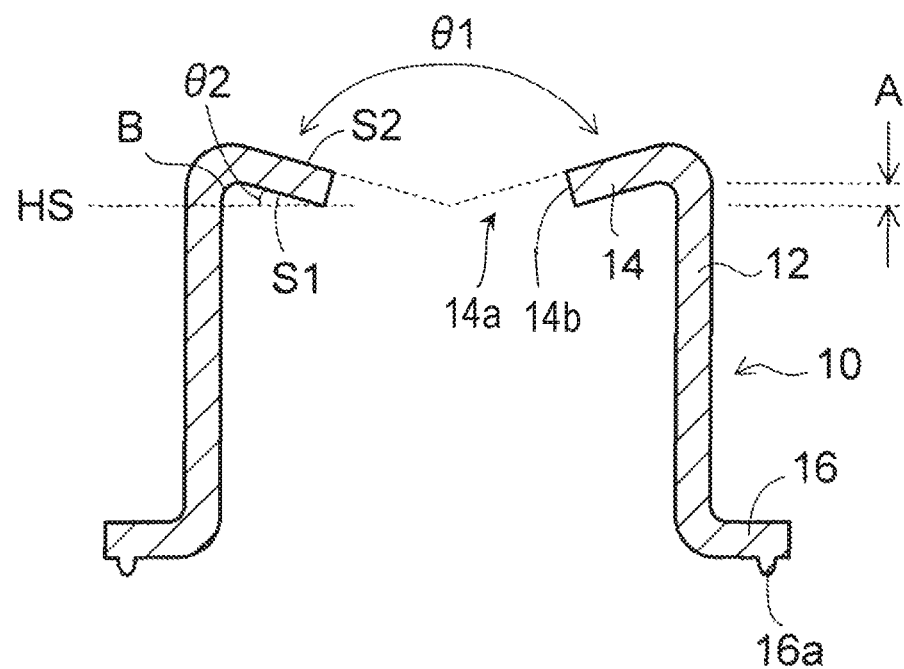
FIG. 3 is a sectional view depicting a cap main body of a cap member in accordance with an exemplary embodiment.
Figure 4:
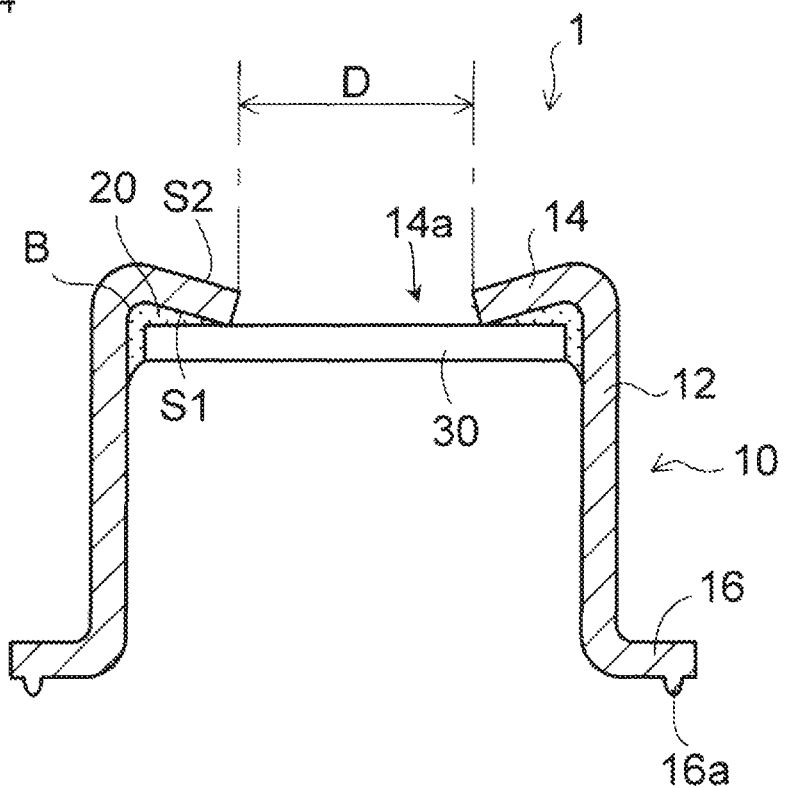
FIG. 4 is a sectional view depicting the cap member in accordance with the exemplary embodiment.

FIG. 3 depicts a cap main body of a cap member of an exemplary embodiment. FIG. 4 depicts the cap member of the exemplary embodiment, and FIGS. 5A to 12B illustrate a manufacturing method of the cap main body of the exemplary embodiment.

Figure 16A:
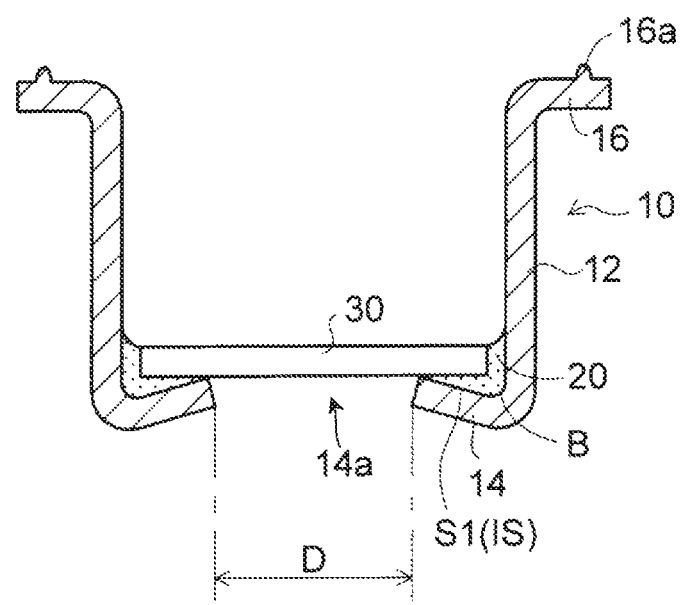
FIGS. 16A and 16B are a sectional view and a plan view depicting the manufacturing method of the cap main body in accordance with the exemplary embodiment (4 thereof).
Figure 16B:
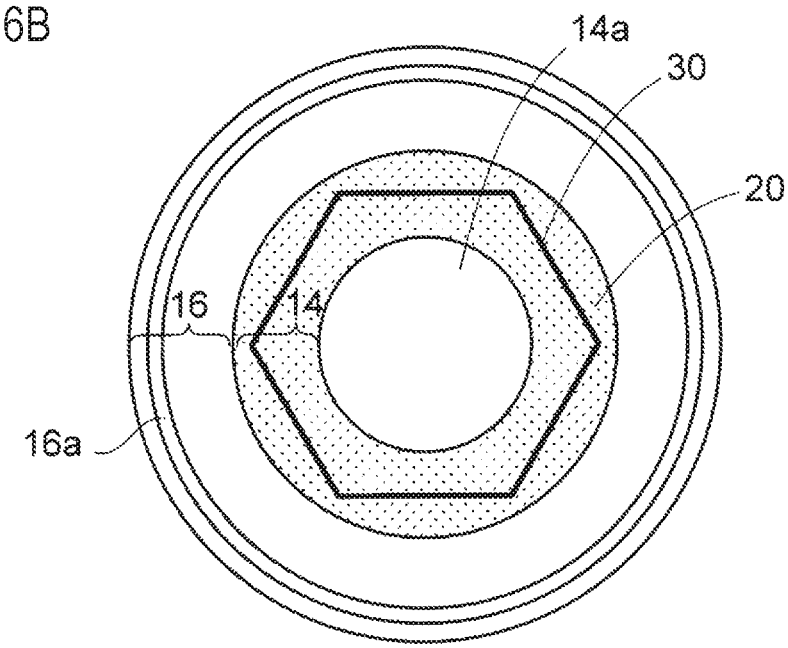
Figure 17:
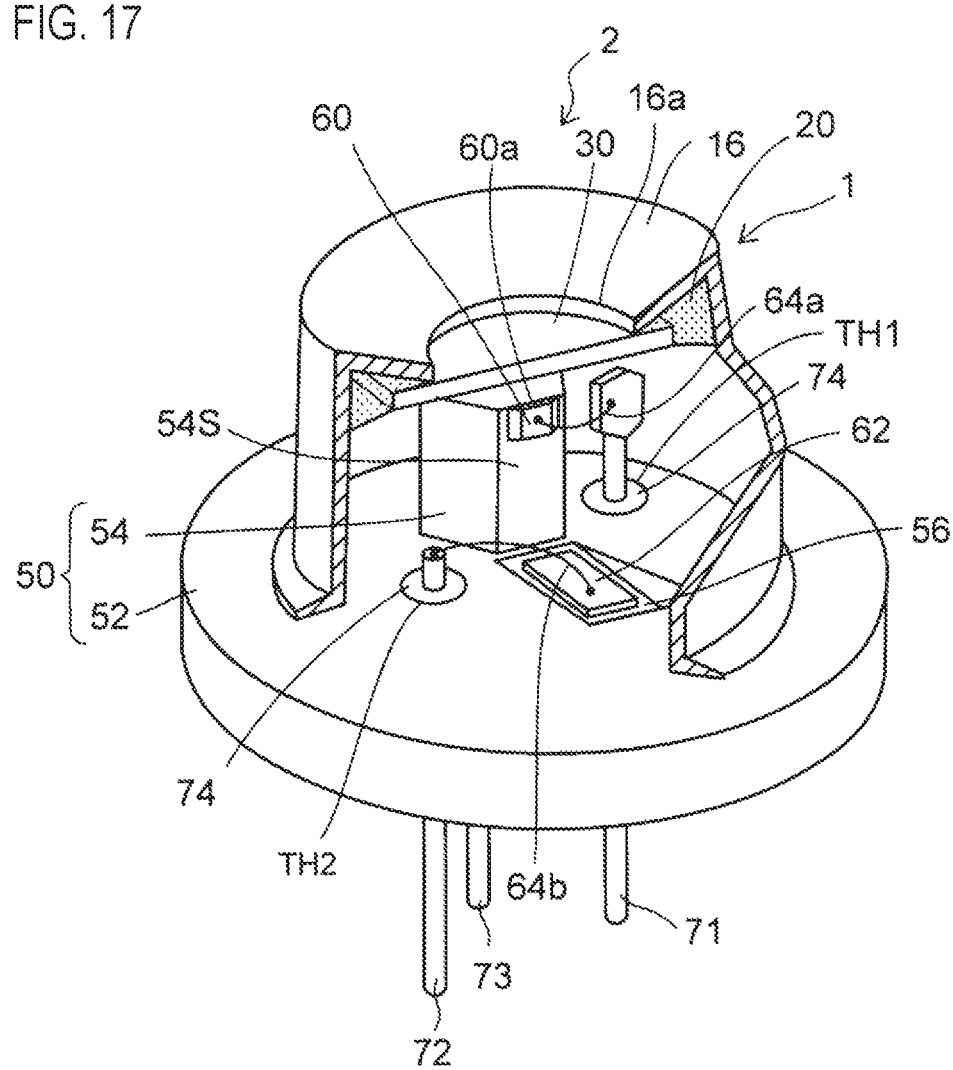
FIG. 17 is a perspective view depicting a light-emitting device in accordance with the exemplary embodiment.

Also, FIGS. 13A to 16B illustrate the manufacturing method of the cap member of the exemplary embodiment, and FIG. 17 depicts a light-emitting device of the exemplary embodiment.

FIG. 3 shows a cap main body of a cap member of an exemplary embodiment. As shown in FIG. 3, a cap main body 10 of the exemplary embodiment has a cylindrical structure and is formed of iron (Fe)-based metal. As the iron (Fe)-based metal, 42 alloy (iron (Fe)/nickel (Ni) alloy) or kovar (iron (Fe)/nickel (Ni)/cobalt (Co) alloy) or the like is favorably used.

The cap main body 10 has a cylindrical part 12 having a hollow inside, an annular top plate part 14 formed inward from an upper end of the cylindrical part 12 and having an opening 14a formed at a central portion thereof, and an annular flange part 16 protruding outward from a lower end of the cylindrical part 12.

That is, the top plate part 14 has the opening 14a formed at the central portion thereof and is configured to cover one end of the cylindrical part 12.

The top plate part 14 is depressed so than an opening end of the opening 14a (a sidewall 14b of the tip end of the top plate part 14) enters the inside of the cylindrical part 12 (the opening end of the opening 14a is located within the cylindrical part 12), and an inner surface (lower surface) of the top plate part 14 is configured as a flat inclined surface from a coupling part B between the cylindric part 12 and the top plate part 14 to the opening end.

In a sectional view of FIG. 3, an angle θ1 of a V-shape formed by crossing lines extending along upper surfaces (outer surface) of the top plate part 14 is set to a range of 130° to 160°.

Also, an inclination angle θ2 of the inner surface of the top plate part 14 relative to a horizontal surface HS is set to a range of 25° to 10°.

Also, a distance A in the height direction in the top plate part 14, which is made as the top plate part 14 is bent, is set to be 0.1 mm to 0.15 mm. The distance A in the height direction in the top plate part 14 is a difference between a height of the coupling part B with the cylindrical part 12 of the inner surface of the top plate part 14 and a height of the tip end of the inner surface of the top plate part 14.

In this way, the inner surface S1 and the outer surface S2 of the top plate part 14 of the cap main body 10 are configured as flat inclined surfaces inclined downward from the coupling part B with the cylindrical part 12 toward the tip end. A height position of the inner surface S1 of the top plate part 14 becomes gradually lower from the coupling part B with the cylindrical part 12 toward the tip end.

Also, an annular projection 16a for resistance welding is formed on a lower surface of the flange part 16 of the cap main body 10.

As described later, the cap main body 10 is formed by processing a metal plate, and the top plate part 14, the cylindrical part 12 and the flange part 16 are integrally coupled with a substantially same thickness.

FIG. 4 depicts the cap member of the exemplary embodiment. As shown in FIG. 4, the cap member 1 of the exemplary embodiment has a transparent window glass 30 disposed below the opening 14a of the top plate part 14 of the cap main body 10 shown in FIG. 3. The window glass 30 is adhered to the inner surface S1 of the top plate part 14 by a low-melting-point glass 20. The low-melting-point glass 20 is a favorable example of the adhesion member.

In this way, the opening 14a of the top plate part 14 of the cap main body 10 is closed and hermetically sealed by the window glass 30 and the low-melting-point glass 20.

One surface of the window glass 30 is in contact with the tip end of the top plate part 14 protruding inward from the cylindrical part 12, and the low-melting-point glass 20 is provided between the inner surface of the top plate part 14 and the window glass 30.

As described in a manufacturing method of a cap member to be described later, the window glass 30 is disposed on the inner surface S1 of the top plate part 14 of the cap main body 10 via the doughnut-shaped low-melting-point glass 20 with the cap main body 10 of FIG. 4 being turned upside down.

The low-melting-point glass 20 is melted by a heating treatment, so that the window glass 30 is adhered to the inner surface S1 of the top plate part 14 of the cap main body 10.

At a state where the cap main body 10 of FIG. 3 is turned upside down, a height position of the tip end of the inner surface S1 of the top plate part 14 of the cap main body 10 is higher than a height position of the coupling part B with the cylindrical part 12.

For this reason, when the low-melting-point glass 20 disposed on the inner surface S1 of the top plate part 14 of the cap main body 10 is melted, the melted low-melting-point glass 20 flows toward the coupling part 13 of the top plate part 14 with the cylindrical part 12.

Also, when the low-melting-point glass 20 is melted, since the window glass 30 is contacted to the tip end of the top plate part 14 of the cap main body 10, it is possible to prevent the outflow of the low-melting-point glass 20 toward the opening 14a.

Alternatively, even when the window glass 30 is not contacted to the tip end of the top plate part 14 of the cap main body 10, the window glass 30 comes close to the tip end of the top plate part 14 of the cap main body 10, so that a flow space of the low-melting-point glass 20 is narrowed and a flow resistance is increased. Therefore, it is possible to prevent the outflow of the low-melting-point glass 20 into the opening 14a.

In this way, the low-melting-point glass 20 flows from a space between the inner surface S1 of the top plate part 14 of the cap main body 10 and an upper surface of the window glass 30 to a space between a side surface of the window glass 30 and an inner wall of the cylindrical part 12 and is stagnated therein.

Alternatively, the space between the side surface of the window glass 30 and the inner wall of the cylindrical part 12 may be left without the low-melting-point glass 20 flowing therein.

In this way, the outflow of the low-melting-point glass 20 from the inner surface S1 of the top plate part 14 of the cap main body 10 into the opening 14a of the top plate part 14 is prevented.

As described later, the cap member 1 of FIG. 4 is applied to a light-emitting device. In order to obtain a desired characteristic when laser light from semiconductor laser elements is emitted outside through the window glass 30, an effective diameter D corresponding to each semiconductor laser element is necessary.

For this reason, a diameter of the opening 14a of the cap main body 10 of the exemplary embodiment is designed to be the effective diameter D necessary for the semiconductor laser element.

In the exemplary embodiment, since the outflow of the opaque low-melting-point glass 20 into the opening 14a, which is formed to have the effective diameter D, of the cap main body 10, is prevented, the transparent window glass 30 is disposed in the entire opening 14a.

In this way, it is possible to positively secure the effective diameter D necessary for each semiconductor laser element. Also, since the low-melting-point glass 20 does not flow into the opening 14a, it is possible to easily cope with a need to further increase the effective diameter D by increasing the opening 14a of the cap main body 10.

Subsequently, a first manufacturing method of the cap main body 10 shown in FIG. 3 is described.

Figure 5A:
FIGS. 5A to 5C are sectional views depicting a first manufacturing method of the cap main body in accordance with the exemplary embodiment (1 thereof).

As shown in FIG. 5A, a metal plate 11 is first prepared. The metal plate 11 is formed of iron (Fe)-based metal such as 42 alloy, kovar or the like, and a thickness thereof is 0.1 mm to 0.2 mm, for example.

Figure 5B:
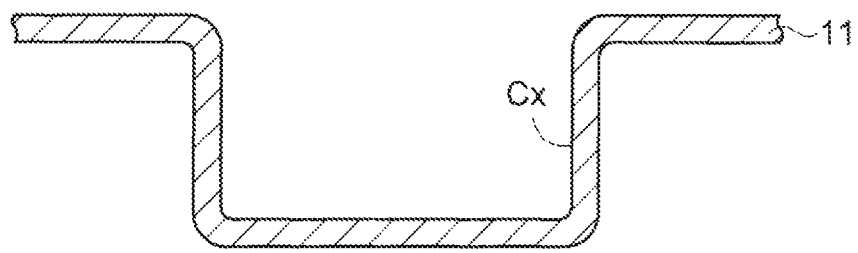

Then, as shown in FIG. 5B, the metal plate 11 is primarily shaped to form a concave part Cx by press working. The concave part Cx has a circular shape, as seen from a plan view, and a depth thereof is set to be about 1 mm, for example.

Figure 5C:
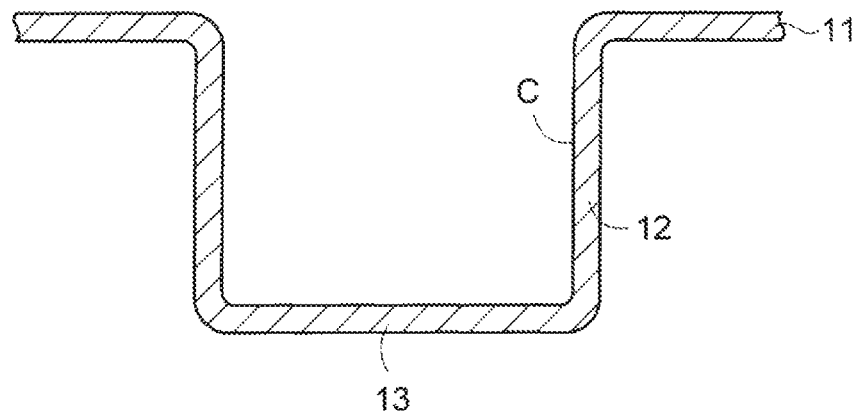

Also, as shown in FIG. 5C, the concave part Cx of the metal plate 11 is secondarily shaped to obtain a cup-shaped concave member C having a desired depth by the press working. The cup-shaped concave member C is formed into a bottomed cylindrical shape having a cylindrical part 12 and a bottom plate 13.

A depth of the cup-shaped concave member C is set to correspond to the height of the cap main body 10, and is set to be about 2 mm to 3 mm, for example.

There is a limit on a depth of a concave part that can be formed by one shaping process. Therefore, when the metal plate 11 is shaped to form the cup-shaped concave member C by the two-time shaping, it is possible to reliably form the cup-shaped concave member C without tearing the metal plate 11.

Figure 6A:
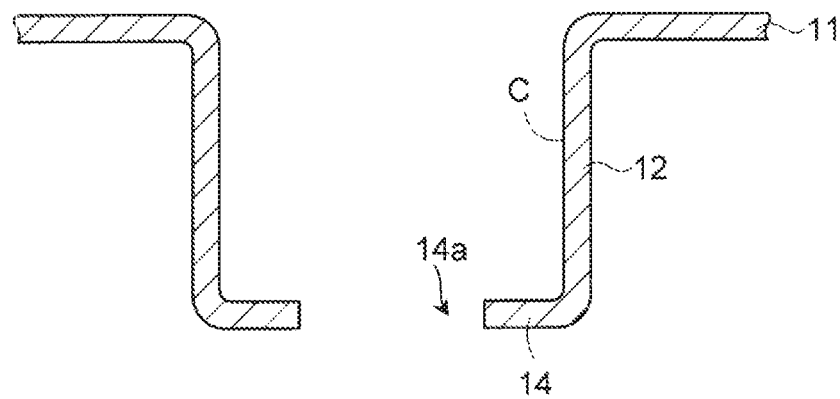
FIGS. 6A and 6B are sectional views depicting the first manufacturing method of the cap main body in accordance with the exemplary embodiment (2 thereof).

Subsequently, as shown in FIG. 6A, a central portion of the bottom plate 13 of the cup-shaped concave member C is punched by the press working, so that an opening 14a is formed. Thereby, the cylindrical part 12 and an annular top plate part 14 coupled to a lower end of the cylindrical part and having the opening 14a formed at the central portion thereof are obtained from the cup-shaped concave member C.

At the state of FIG. 6A, the top plate part 14 is a part of the bottom plate. However, since the top plate part is finally used with being turned upside down, it is referred to as the top plate part 14 for convenience sake.

Figure 6B:
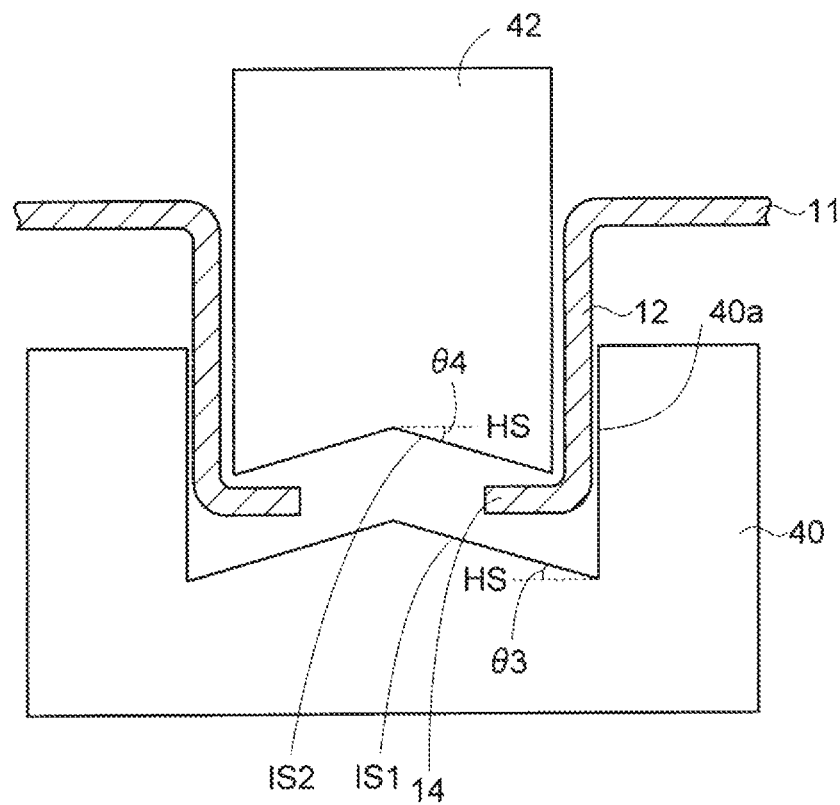

Then, as shown in FIG. 6B, a lower mold 40 and an upper mold 42 are prepared. The lower mold 40 has a concave part 40a corresponding to an outward shape of the cylindrical part 12 of the structure shown in FIG. 6A. A bottom part of the concave part 40a of the lower mold 40 is configured as a conical body, and an inclined surface IS1, which is inclined downward about an apex of the conical body, is provided.

The inclined surface IS1 of the bottom part of the concave part 40a of the lower mold 40 is provided so as to form the inclined top plate part 14 of the cap main body 10 of FIG. 3. An inclination angle θ3 of the inclined surface IS1 relative to a horizontal surface HS is set to be the same as the inclination angle θ2 of the top plate part 14 of the cap main body 10 of FIG. 3. The inclination angle θ3 may be set to be more than inclination angle θ2 in view of the spring back of the metal plate 11.

Also, an outward shape of the upper mold 42 is adjusted to be fitted to the concave part 40a of the lower mold 40. A bottom surface of the upper model 42 is a conical surface corresponding to the conical body of the bottom part of the lower mold 40, and is provided with an inclined surface IS2 corresponding to the inclined surface IS1 of the lower mold 40.

An inclination angle θ4 of the inclined surface IS2, which is a lower surface of the upper mold 42, relative to the horizontal surface HS is set to be the same as the inclination angle θ3 of the inclined surface IS1 of the bottom part of the lower mold 40. The inclination angle θ4 may be set to be more than inclination angle θ2 in view of the spring back of the metal plate 11.

Then, the cylindrical part 12 and the top plate part 14 of the metal plate 11 shown in FIG. 6A are disposed in the concave part 40a of the lower mold 40, and the upper mold 42 is disposed inside the cylindrical part 12 of the metal plate 11. Thereby, the inclined surface IS1 of the lower mold 40 is disposed below the top plate part 14 inside the cylindrical part 12 of the metal plate 11, and the inclined surface IS2 of the upper mold 42 is disposed above the top plate part 14.

Also, as shown in FIG. 7, the upper mold 42 is pressed toward the lower mold 40, so that the horizontal top plate part 14 inside the cylindrical part 12 of the metal plate 11 is sandwiched and bent by the inclined surface IS1 of the lower mold 40 and the inclined surface IS2 of the upper mold 42.

Thereby, the top plate part 14 is inclined upward from a coupling part with the cylindrical part 12 toward a tip end thereof.

In this way, the annular top plate part 14, which has the opening 14a formed at the central portion and is depressed so that an opening end of the opening 14a enters the inside of the cylindrical part 12, is formed. Thereby, an inner surface of the top plate part 14 is configured as a flat inclined surface from the coupling part between the cylindrical part 12 and the top plate part 14 to the opening end.

In the first manufacturing method, after obtaining the top plate part 14 by forming the opening 14a at the central portion of the bottom plate 13 of the cup-shaped concave member C, the top plate part 14 is depressed so that the opening end of the opening 14a enters the inside of the cylindrical part 12.

Thereafter, the cylindrical part 12 and the top plate part 14 of the metal plate 11 are removed from the lower mold 40 and the upper mold 42.

Figure 8A:
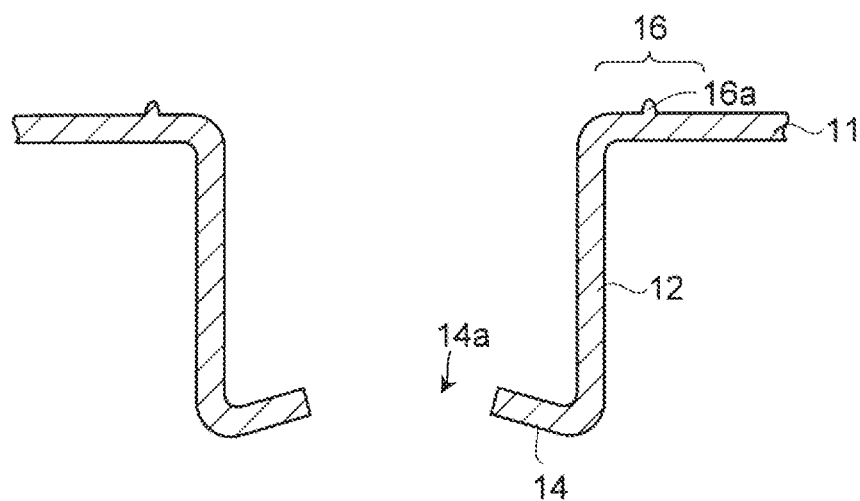
FIGS. 8A and 8B are sectional views depicting the first manufacturing method of the cap main body in accordance with the exemplary embodiment (4 thereof).

Thereby, as shown in FIG. 8A, the cylindrical part 12 coupled to the metal plate 11 and the inclined top plate part 14 coupled to a lower end of the cylindrical part are obtained. Also, an annular projection 16a is formed in a region becoming the flange part 16 of the metal plate 11 by the press working.

Figure 8B:
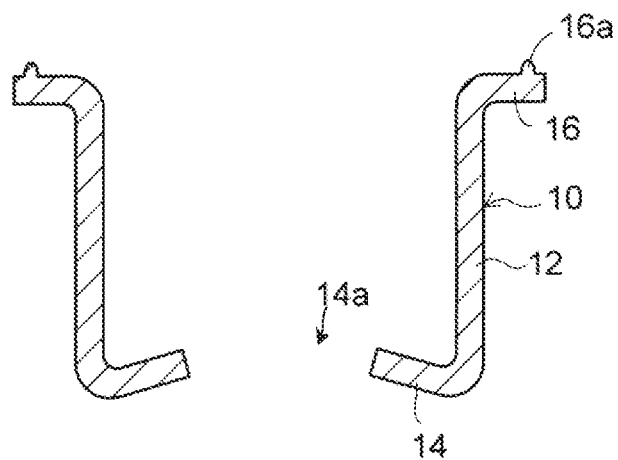

Then, as shown in FIG. 8B, each product region including the top plate part 14, the cylindrical part 12 and the flange part 16 is punched out from the metal plate 11. Thereby, the cap main body 10 of FIG. 3 is obtained with being turned upside down, In the first manufacturing method of the cap main body, after forming the opening 14a of the top plate part 14 of the cup-shaped concave member C, the top plate part 14 is bent upward. For this reason, as shown in FIG. 8B, the sidewall 14b (See FIG. 3) of the tip end of the top plate part 14 becomes an inclined surface inclined inward from an outer side from an upper end toward a lower end.

On the contrary, in the cap main body 10 of FIG. 3 turned upside down from FIG. 8B, the sidewall 14b of the tip end of the top plate part 14 becomes an inclined surface inclined outward from an inner side from the upper end toward the lower end.

Subsequently, a second manufacturing method of the cap main body 10 of FIG. 3 is described. The second manufacturing method is different from the first manufacturing method, in that the region becoming the top plate part is inclined through the bending processing before forming the top plate part with the opening. The detailed descriptions of the same processes as the first manufacturing method are omitted.

Figure 9A:
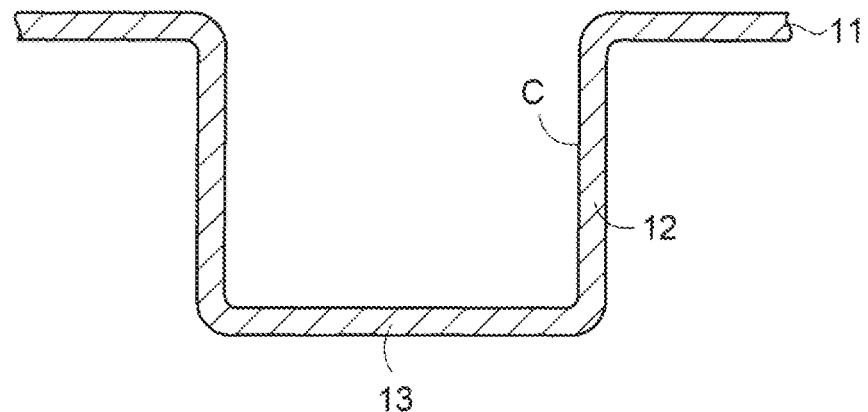
FIGS. 9A and 9B are sectional views depicting a second manufacturing method of the cap main body in accordance with the exemplary embodiment (1 thereof).

As shown in FIG. 9A, the processes similar to the processes of FIGS. 5A to 5C are performed to form the metal plate 11 with the cup-shaped concave member C having the cylindrical part 12 and the bottom plate 13.

Figure 9B:
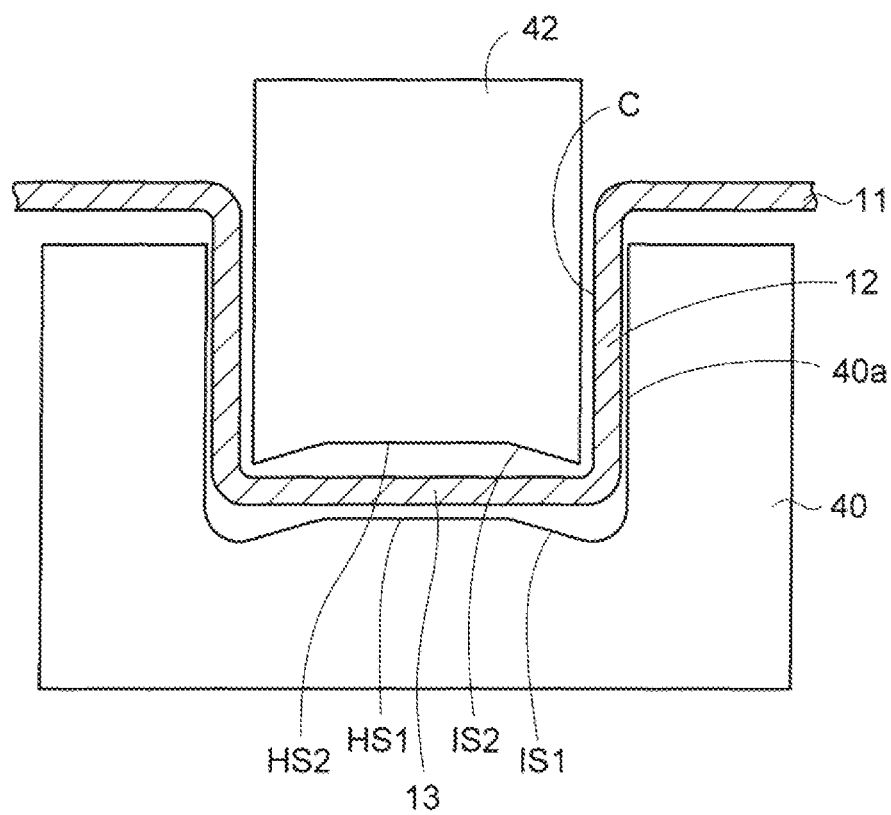

Then, as shown in FIG. 9B, the lower mold 40 and the upper mold 42 are prepared. In the second manufacturing method, the central portion of the bottom surface of the concave part 40a of the lower mold 40 is configured as a flat horizontal surface HS1, and a peripheral edge portion of the bottom surface is configured as an inclined surface IS1. A planar size of the horizontal surface HS1 corresponds to a planar size of the opening 14a of the top plate part 14 shown in FIG. 3.

Also, an inclination angle of the inclined surface IS1 of the peripheral edge portion of the bottom surface of the lower mold 40 is the same as the inclination angle θ3 of the inclined surface IS1 of the lower mold 40 shown in FIG. 6B.

A central portion of the lower surface of the upper mold 42 is provided with a horizontal surface HS2 corresponding to the horizontal surface HS1 of the concave part 40a of the lower mold 40. Also, similarly, a peripheral edge portion of the lower surface of the upper mold 42 is provided with an inclined surface IS2 having the same inclination angle as the inclined surface IS1 of the lower mold 40.

Then, the cup-shaped concave member C of the metal plate 11 of FIG. 9A is disposed in the concave part 40a of the lower mold 40, and the upper mold 42 is disposed inside the cup-shaped concave member C.

Thereby, the horizontal surface IS1 of the lower mold 40 and the horizontal surface HS2 of the upper mold 42 are disposed at the central portion of the bottom plate 13 of the cup-shaped concave member C. Also, the inclined surface IS1 of the lower mold 40 and the inclined surface IS2 of the upper mold 42 are disposed at the peripheral edge portion of the bottom plate 13 of the cup-shaped concave member C.

The peripheral edge portion of the bottom plate 13 of the cup-shaped concave member C is a region becoming the top plate part 14, and the central portion of the bottom plate 13 of the cup-shaped concave member C is a region in which the opening 14a of the top plate part 14 is to be disposed.

Also, as shown in FIG. 10, the upper mold 42 is pressed toward the lower mold 40, so that the peripheral edge portion of the bottom plate 13 of the cup-shaped concave member C is sandwiched and bent by the inclined surface IS1 of the lower mold 40 and the inclined surface IS2 of the upper mold 42.

Thereby, the peripheral edge portion of the bottom plate 13 of the cup-shaped concave member C is processed to have a shape inclined upward from the coupling part with the cylindrical part 12 toward an inner side.

At this time, since the central portion of the bottom plate 13 of the cup-shaped concave member C is sandwiched by the horizontal surface HS1 of the lower mold 40 and the horizontal surface HS2 of the upper mold 42, the central portion is kept as it is a horizontal surface.

In this way, the peripheral edge portion, which is to be the top plate part 14, of the bottom plate 13 of the cup-shaped concave member C is bent to be inclined upward toward an inner side.

In the second manufacturing method, before forming the bottom plate 13 of the cup-shaped concave member C with the opening 14a, the bottom plate 13 is depressed so that the central portion of the bottom plate 13 enters the inside of the cylindrical part 12.

Thereafter, the cup-shaped concave member C of the metal plate 11 are removed from the lower mold 40 and the upper mold 42.

Then, as shown in FIG. 11, the lower mold 40 and the upper mold 42 are prepared. The lower mold 40 is provided with the concave part 40a corresponding to an outward shape of the cup-shaped concave member C of the metal plate 11. Also, the lower mold 40 is provided with an opening 40x at the central portion of the bottom part of the concave part 40a.

The peripheral edge portion of the bottom surface of the concave part 40a of the lower mold 40 is configured as an inclined surface IS3 corresponding to the inclination of the peripheral edge portion of the bottom plate 13 of the cup-shaped concave member C bent in FIG. 10.

The opening 40x of the lower mold 40 is disposed, in correspondence to the central portion of the bottom plate 13 (FIG. 10) of the cup-shaped concave member C at which the opening 14a of the top plate part 14 is to be disposed.

The upper mold 42 includes a punch 44 and a pressing member 46 having an opening 46a formed at a central portion thereof. The punch 44 is inserted in the opening 46a of the pressing member 46. A lower surface of the pressing member 46 is configured as an inclined surface IS4 corresponding to the inclined surface IS3 of the bottom surface of the concave part 42a of the lower mold 40.

Then, the cup-shaped concave member C of the metal plate 11 bent in FIG. 10 is disposed on the concave part 40x of the lower mold 40. Also, at a state where the peripheral edge portion of the bottom plate 13 (FIG. 10) of the cup-shaped concave member C is pressed with the pressing member 46, the central portion of the bottom plate 13 of the cup-shaped concave member C is punched with the punch 44.

Thereafter, the cup-shaped concave member C of the metal plate 11 is removed from the lower mold 40 and the upper mold 42.

Figure 12A:
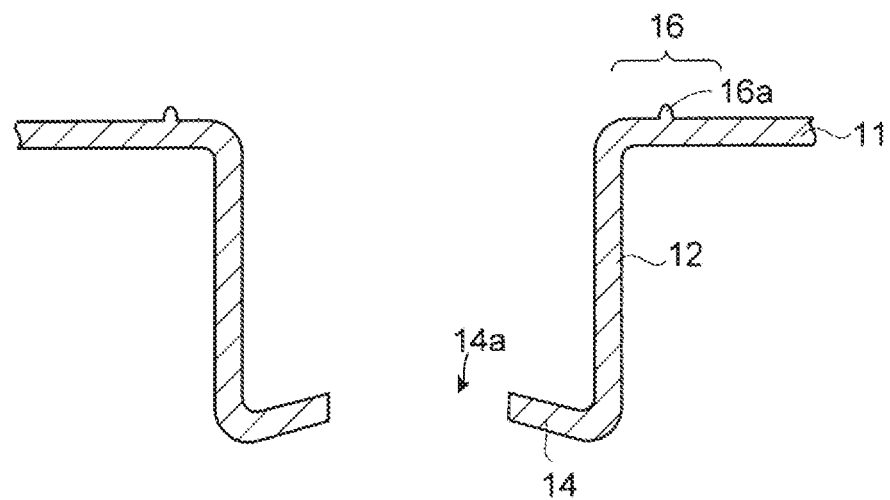
FIGS. 12A and 12B are sectional views depicting the second manufacturing method of the cap main body in accordance with the exemplary embodiment (4 thereof).

Thereby, as shown in FIG. 12A, the cylindrical part 12 coupled to the metal plate 11 and the inclined top plate part 14 coupled to the lower end of the cylindrical part are obtained. The top plate part 14 is formed at the central portion with the opening 14a, and is inclined upward from the coupling part B with the cylindrical part 12 toward the tip end.

Also, an annular projection 16a is formed in a region becoming the flange part 16 of the metal plate 11 by the press working.

Figure 12B:
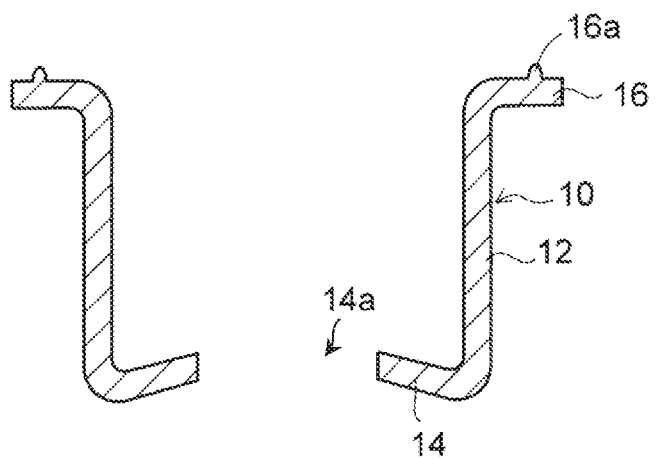

Then, as shown in FIG. 12B, each product region including the top plate part 14, the cylindrical part 12 and the flange part 16 is punched out from the metal plate 11. Thereby, the cap main body 10 of FIG. 3 is obtained with being turned upside down.

In the second manufacturing method of the cap main body, after bending the region becoming the top plate part 14 of the bottom plate 13 of the cup-shaped concave member C, the central portion of the bottom plate 13 is formed with the opening 14a. Therefore, the sidewall of the tip end of the top plate part 14 is formed as a vertical surface.

As described above, in the manufacturing method of the cap member of the exemplary embodiment, the metal plate 11 is first processed to form the cup-shaped concave member C having the cylindrical part 12 and the bottom plate 13. Then, the bottom plate 13 of the cup-shaped concave member C is processed so that the annular top plate part 14 having the opening 14a formed at the central portion is inclined upward from the coupling part of the cylindrical part 12 toward the tip end.

After forming the opening 14a at the central portion of the bottom plate 13 of the cup-shaped concave member C, the peripheral edge portion of the bottom plate 13 becoming the top plate part 14 may be inclined by the bending processing. Alternatively, after inclining the peripheral edge portion, which is to be the top plate part 14, of the bottom plate 13 of the cup-shaped concave member C by the bending processing, the central portion of the bottom plate 13 may be formed with the opening 14a.

Figure 13A:
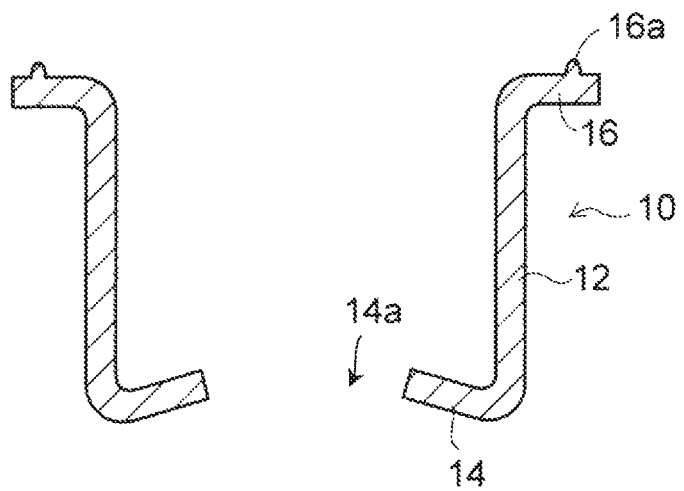
FIGS. 13A and 13B are a sectional view and a plan view depicting a manufacturing method of the cap main body in accordance with the exemplary embodiment (1 thereof).

In the below, a method of adhering the window glass to the cap main body 10 by the low-melting-point glass is described. As shown in FIG. 13A, the cap main body 10 obtained in FIG. 8B is prepared.

Figure 13B:
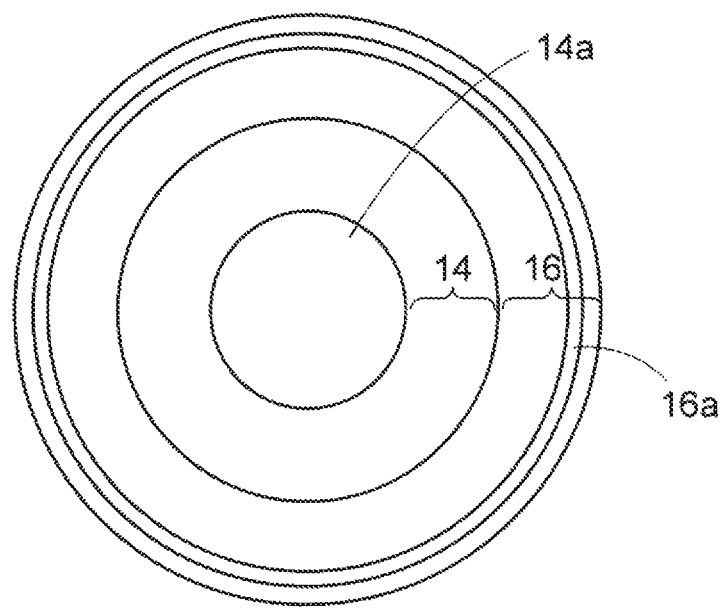

Referring to a plan view of FIG. 13B, the cap main body 10 is circular, as seen from above, and has the annular top plate part 14 extending inward and coupled to one end of the cylindrical part 12. The central portion of the top plate part 14 is formed with the opening 14a. Also, the annular flange part 16 extending outward is coupled to the other end of the cylindrical part 12.

Figure 14A:
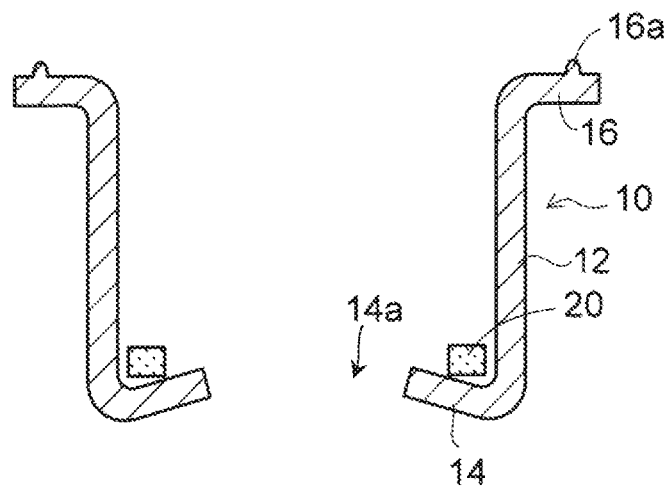
FIGS. 14A and 14B are a sectional view and a plan view depicting the manufacturing method of the cap main body in accordance with the exemplary embodiment (2 thereof).
Figure 14B:
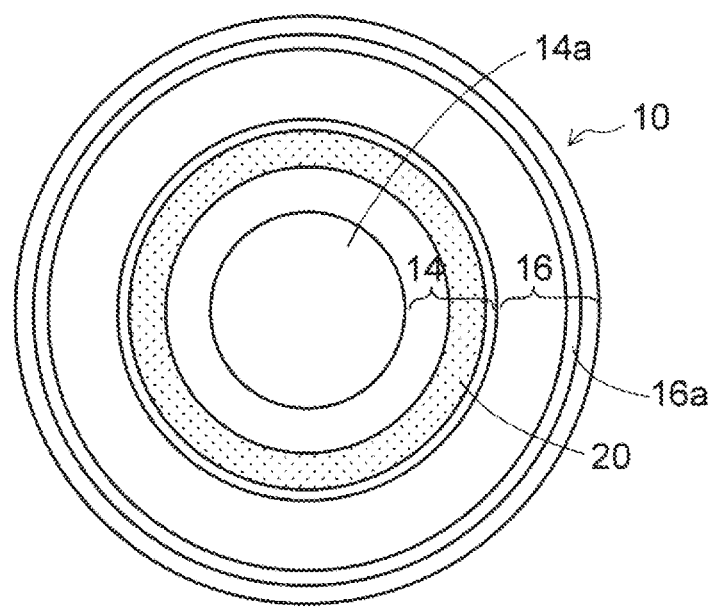

Then, as shown in FIG. 14A, the low-melting-point glass 20 is disposed on the inner surface of the top plate part 14 of the cap main body 10. Referring to a plan view of FIG. 14B, the low-melting-point glass 20 has a doughnut shape and is disposed at an outer position on the inner surface of the top plate part 14 of the cap main body 10.

Figure 15A:
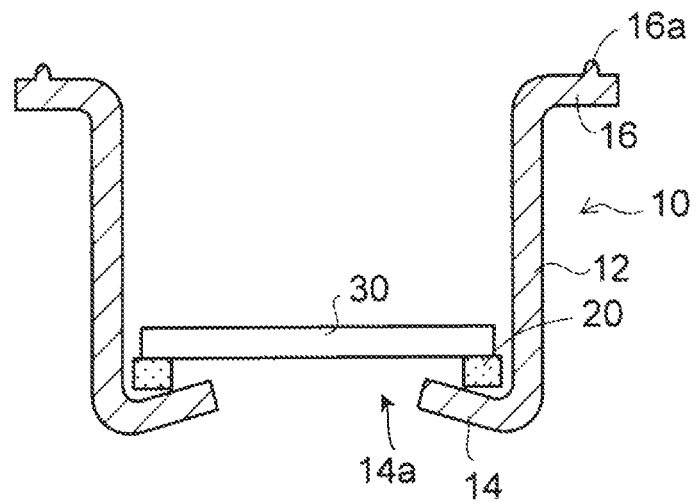
FIGS. 15A and 15B are a sectional view and a plan view depicting the manufacturing method of the cap main body in accordance with the exemplary embodiment (3 thereof).

Then, as shown in FIG. 15A, the transparent window glass 30 is disposed on the low-melting-point glass 20 disposed on the top plate part 14 of the cap main body 10.

Figure 15B:
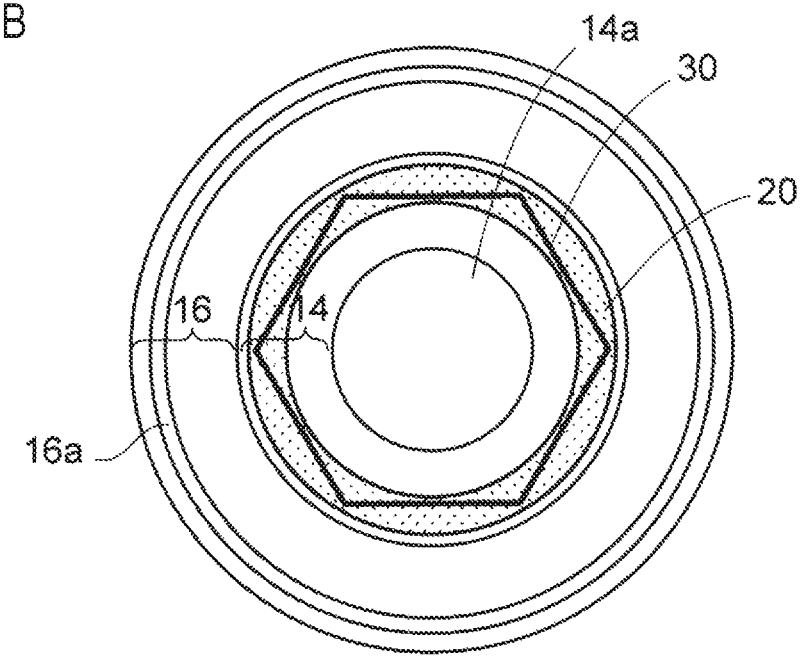

As shown in a plan view of FIG. 15B, the window glass 30 favorably has a regular hexagon shape, as seen from above. The window glass 30 may have diverse shapes such as a circular shape. However, when cutting a large-scale glass substrate to obtain each window glass 30, the regular hexagon shape is preferable because it is possible to easily perform the processing.

Then, as shown in FIG. 16A, the structure of FIG. 15A is disposed in a melting furnace (not shown) and is heated to a temperature of about 500° C.

Thereby, the low-melting-point glass 20 is melted, and the low-melting-point glass 20 is wetted and spread by a weight of the window glass 30. At this time, the inner surface S1 of the top plate part 14 of the cap main body 10 is configured as an inclined surface IS inclined downward from the tip end toward the coupling part B with the cylindrical part 12.

For this reason, the melted low-melting-point glass 20 is difficult to flow from a part on the inner surface S1 of the top plate part 14 toward the opening 14a, so that it flows from the part on the inner surface S1 of the top plate part 14 toward the coupling part B with the cylindrical part 12. Also, when the low-melting-point glass 20 is melted, a lower surface of the window glass 30 is contacted to the tip end of the top plate part 14 of the cap main body 10. Thereby, it is possible to prevent the outflow of the low-melting-point glass 20 toward the opening 14a of the top plate part 14.

Alternatively, even when the window glass 30 is not contacted to the tip end of the top plate part 14 of the cap main body 10, the window glass 30 comes close to the tip end of the top plate part 14 of the cap main body 10, so that a flow space of the low-melting-point glass 20 is narrowed and a flow resistance is increased. Therefore, it is possible to prevent the outflow of the low-melting-point glass 20 into the opening 14a.

In this way, the low-melting-point glass 20 flows into a space between the inner surface S1 of the top plate part 14 and the lower surface of the window glass 30 and a space between the inner wall of the cylindrical part 12 and the side surface of the window glass 30 and is stagnated in the spaces. Since the opaque low-melting-point glass 20 does not flow into the opening 14a of the top plate part 14, the opening 14a of the top plate part 14 can be entirely made to have the effective diameter D of the laser light, so that it is possible to secure the large effective diameter D.

The low-melting-point glass 20 has a melting point lower than the window glass 30. For example, the melting point of the low-melting-point glass 20 is about 500° C., and the melting point of the window glass 30 is about 730° C. The low-melting-point glass 20 is used as the adhesion member, so that it is possible to adhere the window glass 30 to the top plate part 14 of the cap main body 10 with favorable airtightness.

The inventors actually manufactured the cap main body 10 of the exemplary embodiment, and adhered the window glass 30 to the top plate part 14 of the cap main body 10 by the low-melting-point glass 20 in a similar method to the above method. At this time, the top plate part 14 was bent so that the distance A in the height direction in the top plate part 14 of FIG. 3 was about 0.13 mm.

As a result, the outflow of the low-melting-point glass 30 into the opening 14a of the top plate part 14 did not occur, and the effective diameter D could be positively secured.

In the below, a light-emitting device having the cap member 1 of FIG. 4 is described.

As shown in FIG. 17, a light-emitting device 2 has a stem 50. The stem 50 has a circular eyelet 52 and a heat radiation part 54 disposed thereon. The stem 50 is formed by press-working a clad material of iron (Fe) or iron (Fe)/copper (Cu)/iron (Fe) to make the heat radiation part 54 stand on the eyelet 52.

The heat radiation part 54 has an element mounting part 54S on a side surface, and a semiconductor laser element 60 is mounted to the element mounting part 54S via a sub-mount (not shown). The semiconductor laser element 60 is an example of the light-emitting element, and various light-emitting devices can be adopted.

Also, an inclined concave part 56 having an inclined bottom surface is provided in the vicinity of the heat radiation part 54 on the eyelet 52, and a light receiving element 62 is mounted with being inclined on the bottom surface of the inclined concave part 56. As the light receiving element 62, a photo diode is used, for example.

Also, the eyelet 52 is formed with a first through-hole TH1 and a second through-hole TH2. In the first through-hole TH1, a first lead 71 is inserted with being sealed by a glass 74. Also, similarly, in the second through-hole TH2, a second lead 72 is inserted with being sealed by the glass 74.

Also, a third lead 73 is welded to a lower surface of the eyelet 52. The first lead 71 and the second lead 72 are electrically insulated from the stem 50 by the glass 74, and the third lead 73 is electrically connected to the stem 50.

The semiconductor laser element 60 is electrically connected to the first lead 71 via a wire 64a. Also, the light receiving element 62 is electrically connected to the second lead 72 via a wire 64b.

The projection 16a of the flange part 16 of the cap member 1 shown in FIG. 4 is resistance-welded to an upper surface of the eyelet 52 of the stem 50. In FIG. 17, the cap member 1 is shown with a cut perspective view.

In this way, the semiconductor laser element 60 and the light receiving element 62 are accommodated and hermetically sealed in the cap member 1.

The laser light emitted from a light emission surface 60a of the semiconductor laser element 60 is released outside through the window glass 30 of the cap member 1. Also, the light receiving element 62 receives monitor light emitted from an opposite surface to the light emission surface of the semiconductor laser element 60, and a laser output of the semiconductor laser element 60 is controlled on the basis of the received light.

In the light-emitting device 2 of the exemplary embodiment, as described above, since the cap member 1 can stably secure the effective diameter D of a design specification necessary for the semiconductor laser element 60, the favorable optical characteristics are obtained and the reliability can be improved.

1. A manufacturing method of a cap member, the manufacturing method comprising:

processing a metal plate to form a cup-shaped concave member having a cylindrical part and a bottom plate; and processing the bottom plate of the cup-shaped concave member to form an annular top plate part having an opening formed at a central portion thereof and depressed so that an opening end of the opening enters an inside of the cylindrical part, wherein an inner surface of the top plate part is configured as a flat inclined surface from a coupling part between the cylindrical part and the top plate part to the opening end.

2. The manufacturing method according to claim 1, wherein the forming the top plate part comprises:

punching a central portion of the bottom plate to form the opening, thereby obtaining the top plate part coupled to a lower end of the cylindrical part, and depressing the top plate part so that the opening end enters the inside of the cylindrical part.

3. The manufacturing method according to claim 1, wherein the forming the top plate part comprises:

depressing the bottom plate so that a central portion of the bottom plate enters the inside of the cylindrical part, and punching the central portion of the bottom plate to form the opening.

4. The manufacturing method according to one of claims 1 to 3, further comprising:

after the forming the top plate part, disposing an adhesion member on an inner surface of the top plate part, disposing a window glass on the adhesion member; and melting the adhesion member to adhere the window glass to the inner surface of the top plate part by a heating treatment.

What is claimed is:

1. A cap member comprising:

a cylindrical part;

an annular top plate part having an opening formed at a central portion thereof and being configured to cover one end of the cylindrical part;

a window glass disposed inside the cylindrical part; and an adhesion member configured to adhere the top plate part and the window glass to each other, wherein the top plate part is depressed so that an opening end of the opening enters an inside of the cylindrical part, and an inner surface of the top plate part is configured as a flat inclined surface from a coupling part between the cylindrical part and the top plate part to the opening end, and wherein the cylindrical part and the top plate part have a substantially same thickness, and the thickness of an entirety of the top plate part is substantially uniform.

2. The cap member according to claim 1, wherein one surface of the window glass is in contact with a tip end of the top plate part protruding toward the inside of the cylindrical part, and wherein the adhesion member is provided between the inner surface of the top plate part and the window glass.

3. The cap member according to claim 1, wherein an angle of a V-shape formed by lines extending along upper surfaces of the top plate part in a cross-section is set to a range of 130° to 160°.

4. The cap member according to claim 1, wherein an inclination angle of the inner surface of the top plate part relative to a horizontal surface is set to a range of 25° to 10°.

5. The cap member according to claim 1, wherein the entirety of the top plate part and an entirety of walls defining the cylindrical part have the substantially same thickness.

6. A light-emitting device comprising:

a cap member comprising:

a cap main body including:

a cylindrical part, and an annular top plate part having an opening formed at a central portion and being configured to cover one end of the cylindrical part, the top plate part being depressed so that an opening end of the opening enters an inside of the cylindrical part, an inner surface of the top plate part being configured as a flat inclined surface from a coupling part between the cylindrical part and the top plate part to the opening end, and the cylindrical part and the top plate part have a substantially same thickness, and the thickness of an entirety of the top plate part is substantially uniform;

a window glass disposed inside the cylindrical part of the cap main body, and an adhesion member configured to adhere the top plate part and the window glass to each other;

a stem having an element mounting part; and a light-emitting element mounted on the element mounting part, wherein the cap member is fixed to the stem, and the light-emitting element is hermetically sealed by the cap member.

7. The light-emitting device according to claim 6, wherein the entirety of the top plate part and an entirety of walls defining the cylindrical part have the substantially same thickness.

* * * * *